(12) United States Patent
Mori et al.

(10) Patent No.: US 8,083,972 B2
(45) Date of Patent: Dec. 27, 2011

(54) COPPER PARTICULATE DISPERSIONS AND METHOD FOR PRODUCING THE SAME

(75) Inventors: Kensaku Mori, Ehime (JP); Shintarou Okamoto, Ehime (JP); Hiroko Nakata, Ehime (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 130 days.

(21) Appl. No.: 11/989,307

(22) PCT Filed: Jul. 24, 2006

(86) PCT No.: PCT/JP2006/314566
§ 371 (c)(1),
(2), (4) Date: Jan. 24, 2008

(87) PCT Pub. No.: WO2007/013393
PCT Pub. Date: Feb. 1, 2007

(65) Prior Publication Data
US 2009/0261304 A1    Oct. 22, 2009

(30) Foreign Application Priority Data
Jul. 25, 2005 (JP) ................................. 2005-213835

(51) Int. Cl.
*H01B 1/22* (2006.01)
(52) U.S. Cl. ........ 252/512; 252/500; 427/212; 427/215; 427/216; 427/220
(58) Field of Classification Search .................. 252/512, 252/500; 427/212, 215, 216, 217, 220
See application file for complete search history.

(56) References Cited

U.S. PATENT DOCUMENTS

| 4,539,041 A | 9/1985 | Figlarz et al. |
| 4,663,079 A * | 5/1987 | Yamaguchi et al. .......... 252/512 |
| 7,413,771 B2 * | 8/2008 | Arora et al. .................. 427/216 |

FOREIGN PATENT DOCUMENTS

| JP | 10110123 | 4/1998 |
| JP | 2000123634 | 4/2000 |
| JP | 2004143325 | 5/2004 |
| JP | 2004232012 | 8/2004 |
| JP | 2004256857 | 9/2004 |
| JP | 2005097677 | 4/2005 |
| JP | 2005307335 | 11/2005 |
| JP | 2005330552 | 12/2005 |

OTHER PUBLICATIONS

Machine translation of JP2005-307335.*
English Abstract of JP2000123634.

* cited by examiner

*Primary Examiner* — Mark Kopec
*Assistant Examiner* — Haidung Nguyen
(74) *Attorney, Agent, or Firm* — Dykema Gossett PLLC

(57) ABSTRACT

A copper particulate dispersion containing copper particulates coated with water-soluble polymers and hydroxycarboxylic acid; hydroxycarboxylic acid; and polyhydric alcohol and/or a polar solvent. The copper particulate dispersion is produced by adding hydroxycarboxylic acid such as malic acid, citric acid, and the like or a solution thereof into a dispersion containing a polar solvent and copper particulates coated with water-soluble polymers, and stirring the obtained dispersion so that part of water-soluble polymers are substituted by hydroxycarboxylic acid; discharging released water-soluble polymers from the dispersion by ultrafiltration; and subsequently adding hydroxycarboxylic acid, polyhydric alcohol and/or a polar solvent, into the dispersion.

7 Claims, No Drawings

COPPER PARTICULATE DISPERSIONS AND METHOD FOR PRODUCING THE SAME

TECHNICAL FIELD

The present invention relates to a copper particulate dispersion useful for formation of fine circuits for electronic devices, and particularly to a copper particulate dispersion excellent in dispersibility and capable of patterning fine circuits by low-temperature sintering.

BACKGROUND ART

Metal particulates have been conventionally utilized as circuit formation materials such as electronic material-oriented electroconductive pastes, for providing: a printed wiring; an internal wiring of semiconductor; a connection between a printed circuit board and an electronic component; and the like. Particularly, unlike typical particles larger than submicrons, metal particulates having diameters of 100 nm or less can be lowered in sintering temperature, thereby bringing about an idea to utilize metal particulates as low-temperature sintering pastes and the like.

Attention has been particularly and recently directed to techniques such that investigations and developments thereof have been progressed, the techniques each configured to draw a fine circuit pattern in paste or ink containing therein metal particulates by screen printing or by using an inkjet printer, for example, followed by low-temperature sintering to form circuits. Although developments adopting silver particulates have preceded the other developments in the present state, silver has an essential defect of migration upon usage thereof as a circuit formation material, thereby bringing about a demand for development of a copper particulate dispersion for a paste, ink, and the like.

Here, unlike other noble metals, copper has a nature susceptible to oxidation, so that conduction of technical development of a copper particulate dispersion requires consideration of oxidation resistance of copper particulate not only in a synthesis stage of particulates but also in a situation where the dispersion is prepared and used as an ink.

As such, there has been disclosed an electroconductive ink in Patent Document 1 based on a combination of metal colloidal particles and various additives, for example. Although such an electroconductive ink is allowed to utilize a mixed colloid containing, as a main component, silver therein which requires no consideration of oxidation resistance, the electroconductive ink is not allowed to utilize a mixed colloid containing, as a main component, copper which requires oxidation resistance, thereby still stopping short of solving the problem of oxidation resistance suffered by a copper particulate dispersion, in the present state.

Further, in case of drawing a circuit pattern by an inkjet printer, metal particulates contained in an ink are required to keep long-term dispersibility in the ink. As such, for metal particulates to be used in inks for inkjet printers, it has been typically conducted to coat metal particulates with a polymer dispersant, to guarantee long-term dispersion stability.

In general, as a method for producing fine particles which is suitable for mass-production, there is a method to synthesize fine particles using chemical reaction in a liquid phase. The method to synthesize fine particles is no exception for producing metal particulates as well. For example, a method for reducing metallic compounds in a solution by reducing agent such as hydrazine is well known.

Further, there is well known a polyol method (see Patent Document 2, for example), as a method for synthesizing metal particulates in a concentrated system having a higher productivity. The polyol method is configured to heat and reduce an oxide or complexes of copper within polyol, in a manner that the polyol plays three roles of a solvent, a reducing agent, and a protective agent, thereby enabling obtainment of metal particulates in submicron or micron orders even in the concentrated system.

To obtain metal particulates having diameters of 100 nm or less by means of such liquid phase based reduction, it is effective to coat surfaces of the particulates with water-soluble polymers such as polyvinyl pyrrolidone, polyvinyl alcohol, or gelatin so as to restrict growth of the particulates, and to avoid agglomeration of the particulates. To this end, many methods have been proposed, in such a manner to conduct addition of water-soluble polymers upon reductive reaction or after obtainment of particulates to thereby cause the polymers to be adsorbed onto the particulates (see Patent Document 3 and Patent Document 4, for example).

In turn, the present inventors have proposed methods each configured to obtain copper particulates by heating and reducing an oxide, hydroxide, or complexes of copper in a solution made of ethylene glycol, diethylene glycol, or triethylene glycol, in a manner to add noble metal ions for production of nuclei and to add water-soluble polymers as a dispersant such as polyvinyl pyrrolidone, polyethyleneimine, or the like, thereby obtaining copper particulates having diameters of 100 nm or less excellent in dispersibility (see Patent Document 5, Patent Document 6, and Patent Document 7, for example).

The metal particulate dispersions obtained according to the methods each contain metal particulates which have diameters of 100 nm or less coated with water-soluble polymers and which are stably dispersed in the dispersion, thereby also exhibiting an excellent oxidation resistance. As such, technical developments are being conducted to utilize the metal particulate dispersion in a state of ink or paste, in a manner to draw a fine circuit pattern by an inkjet printer or by means of screen printing and to heat and sinter the circuit pattern at 150 to 400° C. by utilizing a low-temperature sintering ability specific to metal particulates having diameters of 100 nm or less, thereby forming a circuit.

However, insofar as based on the dispersion containing therein metal particulates coated with water-soluble polymers, it has been difficult to achieve simultaneous establishment of a film-forming ability of the dispersion and an electroconductive property of a sintered film. Namely, since the coated macromolecule layer for keeping dispersibility rather acts as a factor to obstruct sintering, it has been impossible to achieve a sintered film having a sufficient electroconductivity insofar as based on a thickness of typically formed polymer coating layer. When sintering temperatures are raised to solve this problem, there are caused rapid thermal decomposition and evaporation of the polymer coating layer together with a considerable shrinkage thereof, thereby failing to form a continuous circuit.

In turn, excessively decreased thicknesses of polymer coating layers fail to keep dispersibility of metal particulates in a dispersion, and deteriorate oxidation resistance of metal particulates. As such, it becomes important to control an atmosphere upon sintering, particularly in case of copper particulates apt to be oxidized in the atmospheric air, such that introducing hydrogen or sintering in a vacuum atmosphere enables formation of an electroconductive film capable of withstanding practical use (see Patent Document 8, for example).

However, sintering in a hydrogen atmosphere or vacuum atmosphere leads to a complicated configuration of apparatus, a higher cost, and a problem of safety.

Under such circumstances, it is desired to provide a copper particulate dispersion for circuit formation, which adopts copper particulates excellent in migration resistance, which possesses an excellent dispersibility and oxidation resistance of copper particulates, which possesses an excellent film-forming ability such that sintering can be conducted under a simple condition of weakly oxidative atmosphere or the like, and which is also capable of achieving a satisfactory electroconductive property of a sintered film.

Patent Document 1: JP-A-2004-143325
Patent Document 2: JP-A-59-173206
Patent Document 3: JP-A-2004-232012
Patent Document 4: JP-A-2004-256857
Patent Document 5: JP-A-2005-097677
Patent Document 6: JP-A-2005-307335
Patent Document 7: JP-A-2005-330552
Patent Document 8: JP-A-2000-123634

DISCLOSURE OF THE INVENTION

Problem to be Solved by the Invention

The present invention has been carried out in view of such conventional circumstances, and it is therefore an object of the present invention to provide a copper particulate dispersion containing therein copper particulates having diameters of 100 nm or less, suitable as a circuit formation material by low-temperature sintering, which dispersion possesses not only an excellent dispersibility and oxidation resistance of copper particulates but also an excellent film-forming ability such that sintering can be conducted under a simple condition of weakly oxidative atmosphere or the like, and which dispersion is also capable of achieving a satisfactory electroconductive property of a sintered film.

Means for Solving the Problem

To achieve the object, the present inventors have earnestly and repetitively conducted investigations, and have found that it is possible to obtain: an excellent film-forming ability of a dispersion containing therein copper particulates having diameters of 100 nm or less coated with water-soluble polymers; and a satisfactory electroconductivity of a sintered film; without deteriorating dispersibility of the copper particulates in the dispersion, by substituting part of polymer coating layers with hydroxycarboxylic acid and by adding hydroxycarboxylic acid, polyhydric alcohol and/or polar solvent, thereby narrowly realizing the present invention.

Namely, a first aspect of the present invention provides a copper particulate dispersion comprising:
copper particulates having diameters of 100 nm or less and coated with water-soluble polymers and hydroxycarboxylic acid;
hydroxycarboxylic acid; and
polyhydric alcohol and/or a polar solvent.

In the copper particulate dispersion of the first aspect of the present invention, the water-soluble polymer is preferably at least one member selected from polyvinyl pyrrolidone, polyethyleneimine, polyallylamine, polyvinyl alcohol, and gelatin. Further, the hydroxycarboxylic acid is preferably at least one member selected from lactic acid, malic acid, citric acid, and gluconic acid. Moreover, the polyhydric alcohol is preferably at least one member selected from ethylene glycol, diethylene glycol, triethylene glycol, tetraethylene glycol, and polyethylene glycol.

In the copper particulate dispersion of the first aspect of the present invention, a coated amount of the water-soluble polymers is preferably 3 mass % or less relative to copper particulates, and a total coated amount of the water-soluble polymers and the hydroxycarboxylic acid is 2.5 mass % or more relative to copper particulates.

In the copper particulate dispersion of the first aspect of the present invention, the polar solvent is preferably at least one member selected from water, methanol, ethanol, isopropanol, methyl carbitol, ethyl carbitol, and butyl carbitol.

A second aspect of the present invention further provides a method for producing a copper particulate dispersion, comprising the steps of:
adding hydroxycarboxylic acid or a solution thereof into a dispersion containing a polar solvent and copper particulates having diameters of 100 nm or less and coated with water-soluble polymers, and stirring the obtained dispersion, so that part of water-soluble polymers coated on copper particulates are substituted by hydroxycarboxylic acid;
discharging released water-soluble polymers from the dispersion by ultrafiltration; and
subsequently adding hydroxycarboxylic acid or a solution thereof, polyhydric alcohol and/or a polar solvent, into the dispersion.

Effect of the Invention

According to the present invention, copper particulates in the dispersion are coated with proper amounts of water-soluble polymers and hydroxycarboxylic acid, thereby enabling the dispersion to possess excellent dispersibility and oxidation resistance of copper particulates and to be low-temperature fired even in an atmosphere containing oxygen, and enabling achievement of a satisfactory electroconductive property of a sintered film.

Thus, the copper particulate dispersion of the present invention is suitable for production of a homogeneous electroconductive film by low-temperature sintering when prepared into a state of ink or paste, and is capable of coping with finely pitched circuit densities. Particularly, the copper particulate dispersion configured with copper particulates having diameters of 50 nm or less is useful as an ink for a latest inkjet printer, and is preferably usable for formation of a fine circuit pattern by means of the inkjet printer.

BEST MODE FOR CARRYING OUT THE INVENTION

Generally, in order to obtain particulates having diameters of 100 nm or less in a reductive reaction for obtaining copper particulates, it is required to restrict growth of particulates and to avoid agglomeration of the particulates, so that delivery of a large amount of dispersant is carried out. Widely used as a dispersant at that time are water-soluble polymers, since a solvent to be used for reductive reaction for obtaining copper particulates is typically a polar solvent such as water, alcohols, or the like. Copper particulates in the thus obtained dispersion have surfaces coated with water-soluble polymers.

Further, diameters of copper particulates are preferably 100 nm or less so as to enable low-temperature sintering, and particulate diameters of 50 nm or less are particularly preferable when the dispersion is used as an ink for inkjet. In turn, averaged particulate diameters less than 10 nm lead to not only considerable agglomeration of particulates but also lowered oxidation resistance, so that averaged particulate diameters of 10 nm or more are desirable.

The copper particulate dispersion in the present invention is so constituted that part of water-soluble polymers coated on surfaces of such copper particulates are substituted by hydroxycarboxylic acid, and hydroxycarboxylic acid is further added into the dispersion. By substituting part of water-soluble polymers coated on copper particulates by hydroxycarboxylic acid, it becomes possible to decrease a coated amount of the water-soluble polymers which otherwise act as a factor to obstruct sintering, while keeping a satisfactory dispersibility of copper particulates within the dispersion.

Besides the fact that hydroxycarboxylic acid has a lower decomposition temperature and thus does not disturb sintering, hydroxycarboxylic acid acts as a reducing agent, so that low-temperature sintering is progressed without oxidation of copper particulates even when oxygen is contained in an atmosphere upon sintering, thereby enabling obtainment of a defect-free and satisfactory electroconductive film.

However, excessively decreased coated amounts of water-soluble polymers deteriorate dispersibility of copper particulates in the dispersion, thereby requiring compensation for the decreased coated amount of water-soluble polymers by a coating of hydroxycarboxylic acid, thereby simultaneously establishing electroconductivity of a sintered film and a dispersibility of copper particulates.

To achieve a satisfactory electroconductivity of a film to be obtained by low-temperature sintering, it is desirable that the residual coated amount of the water-soluble polymers is 3 mass % or less relative to copper particulates. Meanwhile, to keep dispersibility of copper particulates in the dispersion, the residual coated amount of the water-soluble polymers is preferably 0.5 mass % or more, and the total coated amount of water-soluble polymers and hydroxycarboxylic acid is preferably 2.5 mass % or more relative to copper particulates. Further, since excessive total coated amounts of water-soluble polymers and hydroxycarboxylic acid adversely affect an electroconductivity of a sintered film, the total coated amount is to be preferably 30 mass % or less relative to copper particulates.

Desirable as water-soluble polymer is polyvinyl pyrrolidone, polyethyleneimine, polyallylamine, polyvinyl alcohol, gelatin, or the like from a standpoint of an absorptivity to copper particulates and an effect for improving dispersibility.

In the present invention, there is expressed an important function by hydroxycarboxylic acid and polyhydric alcohol added into the dispersion, in addition to hydroxycarboxylic acid coated on copper particulates. Namely, with heating of the coated dispersion upon sintering, hydroxycarboxylic acid polymerizes with polyhydric alcohol to form a polymer in a manner that a hardening effect thereupon contributes to improving adherence among copper particulates and between copper particulates and a substrate, thereby promoting sintering while preventing oxidation to form a film excellent in adherence to the substrate. Further, additional heating leads to decomposition at 200° C. or higher in case of polyester, for example, so that polyester at a surface layer apt to become hot is caused to decompose to thereby improve an electroconductive property of a film surface, thereby allowing achievement of a sintered film excellent in electroconductivity and in adherence to a substrate.

For expression of such a function, the addition amount of hydroxycarboxylic acid into the dispersion is preferably 5 to 30 mass %, and more preferably 7 to 20 mass % relative to copper particulates. Excessively smaller addition amounts of hydroxycarboxylic acid, concretely less than 5 mass %, lead to insufficient occurrence of polymerization reaction, and to failure of recognition of an effect for improving dispersibility, electroconductivity, and the like. Further, addition exceeding 30 mass % fails to exhibit an additional improvement of the effect.

Desirable as hydroxycarboxylic acid to be used in the present invention is a compound having two or more —COOH groups and one or more —OH groups in which the number of —COOH groups is the same as or greater than the number of —OH groups, and concretely desirable are lactic acid, gluconic acid, malic acid, citric acid, and the like. Such hydroxycarboxylic acid contributes to hardening the dispersion, based on formation of polymer by condensation polymerization between —COOH groups possessed by hydroxycarboxylic acid and —OH groups of polyhydric alcohol added into the solvent, caused by heating and sintering at a relatively low temperature upon formation of an electroconductive film.

Further, the addition amount of polyhydric alcohol into the dispersion is preferably 2 to 20 mass % relative to copper particulates, such that addition amounts less than 2 mass % lead to a less hardening effect by polyester, and addition amounts exceeding 20 mass % disadvantageously bring about an increased viscosity of ink. The polyhydric alcohol also serves to adjust a viscosity, a surface tension, and the like of ink.

In the present invention, it is desirable to use polyhydric alcohol having two or more —OH groups for condensation polymerization with hydroxycarboxylic acid, and concretely, the polyhydric alcohol is at least one member selected from ethylene glycol, diethylene glycol, triethylene glycol, tetraethylene glycol, and polyethylene glycol.

The solvent to be used for the copper particulate dispersion of the present invention is desirably a polar solvent from a standpoint of compatibility with polyol, and is preferably water, an alcohol based organic solvent, or a mixed solvent thereof. Concretely usable are one or more members of water, methanol, ethanol, isopropanol, methyl carbitol, ethyl carbitol, and butyl carbitol. Also upon preparation of ink or paste, it is possible to appropriately combine such solvents with one another to adjust a dry degree, a viscosity, and the like of the prepared substance.

As described above, the copper particulate dispersion of the present invention is characterized in that polyhydric alcohol is added together with a lot of total addition amount of water-soluble polymers and hydroxycarboxylic acid both coated on copper particulates, and hydroxycarboxylic acid added into the solvent such that the total addition amount is desirably 7.5 mass % or more, more preferably 9.5 mass % or more relative to copper particulates, which total addition amount appears to adversely affect electroconductivity of a sintered film from a conventional standpoint, whereas such a total addition amount rather improves oxidation resistance of copper particulates and improves an electroconductivity of a sintered film.

There will be concretely explained a method for producing copper particulate dispersion of the present invention. Firstly, there is prepared a dispersion of copper particulates having diameters of 100 nm or less and coated with water-soluble polymers, which dispersion is produced by a known method proposed by the present inventors (see Patent Documents 5 to 7) or the like. For example, copper particulates are synthesized in a liquid phase, by heating and reducing an oxide, hydroxide, or complexes of copper in a solvent made of polyethylene glycol or ethylene glycol. To obtain nuclei for particulate formation at that time, there is added a silver salt or a noble metal salt such as a palladium salt, while using the water-soluble polymers such as polyvinyl pyrrolidone as a dispersant. Further, it is desirable to add sodium hydroxide, an alkaline organic compound, or the like, as a reductive reaction control agent.

At an initial stage of the reductive reaction, the noble metal salt is reduced to produce noble metal nuclei, such that Cu reducedly obtained from the oxide, hydroxide, or complexes of copper is deposited onto the noble metal nuclei, thereby forming fine and uniform copper particulates having diameters of 100 nm or less. The water-soluble polymers such as polyvinyl pyrrolidone added as the dispersant serve to coat surfaces of reducedly deposited copper particulates, in a manner to prevent contact among copper particulates by virtue of steric hindrance, thereby promoting production of copper particulates substantially free of agglomeration and excellent in dispersibility. The addition amount of the water-soluble polymers such as polyvinyl pyrrolidone is preferably 0.1 or more, more preferably 0.4 or more in terms of mass ratio relative to copper. Only, excessive addition amounts lead to excessively increased viscosities of dispersions and to excessively increased residual amounts of water-soluble polymers, so that the addition amount is to be preferably restricted to less than 3.0 in terms of the mass ratio.

Further, in the present invention, added to the copper particulate dispersion in this state is hydroxycarboxylic acid or a solution of hydroxycarboxylic acid, followed by ultrafiltration of cross-flow type with stirring, in a manner to substitute part of water-soluble polymers coated on copper particulates by hydroxycarboxylic acid such that the released water-soluble polymers and the solvent are discharged as a filtrate. Thereafter, the concentrated copper particulate dispersion is furthermore added thereinto hydroxycarboxylic acid or a solution of hydroxycarboxylic acid, thereby obtaining a copper particulate dispersion according to the present invention adjusted to a predetermined copper concentration.

The copper particulate dispersion obtained according to the present invention combiningly possesses a film-forming ability thereof upon sintering and an electroconductivity of a sintered film, together with an excellent oxidation resistance. For example, the dispersion can be low-temperature sintered in a short time in a nitrogen atmosphere containing therein oxygen of 0.1 vol %, and concretely, sintering only for 5 minutes in a low-temperature range of 250° C. to 300° C. allows obtainment of an electroconductive film having a volume specific resistance of 20 μΩ·cm or less. Film thicknesses of 1 μm or less allow for obtainment of electroconductive films each having a volume specific resistance of 10 μΩ·cm or less. These electroconductive films are continuous, exhibit metallic luster, and are sufficiently excellent in film-forming ability.

EXAMPLES

Firstly, there was prepared a dispersion of copper particulates coated with water-soluble polymers, according to a known method. Namely, 80 g of a cuprous oxide ($Cu_2O$) powder and 60 g of polyvinyl pyrrolidone (PVP) were added into 1.0 liter of ethylene glycol (EG) as a reaction solvent, followed by heating with stirring, and then 1.5 g of sodium hydroxide and a silver nitrate solution calculated as 1.6 g of Ag amount were added into the solution, followed by retention at 150° C. for one hour for reducingly depositing copper particulates, thereby obtaining a copper particulate dispersion in a deep red color. Note that the used PVP had a molecular weight of 10,000. Measurement of the obtained copper particulate dispersion by a dynamic light scattering type granulometer, showed that the dispersion was configured with copper particulates having diameters of 100 nm or less and an averaged particulate diameter of 45 nm, in a monodispersed nature and free of agglomeration.

1.0 liter of the copper particulate dispersion (Cu: 7 mass %) was concentrated down to about 200 cc by ultrafiltration of cross-flow type, followed by addition of ion exchange water up to a total volume of 1 liter, and then the filtrate was discharged to the exterior of the system by ultrafiltration with stirring, thereby concentrating the solution containing-copper particulates down to 100 cc. This manipulation was repeated three times, to remove the reaction solvent, polyvinyl pyrrolidone (PVP) as the excessive dispersant, and sodium hydroxide, thereby obtaining a concentrated copper particulate dispersion (A). This concentrated copper particulate dispersion (A) had a copper concentration of 65 mass %.

For the concentrated copper particulate dispersion (A), there was evaluated a coated amount of polyvinyl pyrrolidone (PVP). Namely, the concentrated copper particulate dispersion (A) was filtered by a membrane filter having pore diameters of 25 nm, and the collected copper particulates were dried at 80° C. for 2 hours in vacuum, followed by thermogravimetry up to 600° C. in a nitrogen atmosphere, thereby detecting a weight decrease of 4% from 180° C. through 420° C. This weight decrease was due to thermal decomposition of PVP, and this analysis result showed that polyvinyl pyrrolidone was coated on copper particulates at a ratio of 4 mass %.

Example 1

To substitute part of PVP coated on copper particulates, aqueous 0.5 mass % citric acid solution was added into 100 cc of the concentrated copper particulate dispersion (A) in a manner to dilute it up to 10 times the volume, and then the diluted dispersion was concentrated down to 100 cc by discharging the solvent therefrom by ultrafiltration of cross-flow type with stirring. Further, the concentrated dispersion was diluted up to 10 times the volume by adding thereto an aqueous 0.5 mass % citric acid solution, followed by concentration down to 120 cc by conducting the same ultrafiltration manipulation. The thus obtained concentrated copper particulate dispersion (B) was excellent in dispersibility, and free of precipitation.

For the concentrated copper particulate dispersion (B), there was evaluated a coated amount of polyvinyl pyrrolidone (PVP). Namely, the concentrated copper particulate dispersion (B) was filtered by a membrane filter having pore diameters of 25 nm, and the collected copper particulates were dried at 80° C. for 2 hours in vacuum, followed by thermogravimetry up to 600° C. in a nitrogen atmosphere, thereby detecting a weight decrease of 2.6% from 180° C. through 300° C. and a weight decrease of 1.3% from 300° C. through 420° C. The former weight decrease corresponds to a simultaneous decomposition region of citric acid and PVP, and the latter weight decrease corresponds to a decomposition region of PVP. Subtracting a contributory amount of PVP from the former weight decrease, provides an evaluation of 2% for the weight decrease corresponding to citric acid coatings and an evaluation of 2% for the weight decrease corresponding to PVP coatings. Here, the contributory amount of PVP was obtained by: conducting thermogravimetry for copper particulates coated with PVP only, in a manner to obtain a ratio of PVP decomposition ratio from 180° C. through 300° C. and from 300° C. through 420° C.; and multiplying the ratio by the above-described weight decrease from 300° C. through 420° C. corresponding to PVP coatings. Thus, it was recognized that about 50% of PVP (4 mass %) coated on copper particulates was substituted by citric acid.

Next, 100 cc of the concentrated copper particulate dispersion (B) was added thereinto citric acid in an amount of 15 mass % relative to copper particulates, followed by further addition of diethylene glycol in an amount of 5 mass % relative to copper particulates, and a small amount of water, so as to adjust a concentration and a viscosity, thereby producing a copper particulate dispersion of sample 1 according to the present invention. The copper particulate dispersion had a copper concentration of 40 mass %, and a viscosity of 12 mPa·s when measured by a vibration viscometer. Note that Table 1 to be shown later collectively shows coated amounts of PVP and citric acid, dispersibility, addition amount of citric acid, and the like, for the copper particulate dispersion of sample 1.

The obtained copper particulate dispersion of sample 1 was used to draw a circuit pattern onto a glass substrate by an inkjet printer, and the drawing was smoothly conducted without any clogging of an inkjet nozzle. The obtained pattern was sintered in a reflow furnace in a nitrogen atmosphere containing 0.1 vol % of oxygen, under the condition listed in Table 2 to be shown later. The obtained electroconductive film was observed for a film configuration, the film thickness was measured by observing a broken cross section of a substrate by means of a scanning electron microscope, and the electrical resistance was measured by a four-terminal method, thereby calculating a volume specific resistance. The obtained result is shown in Table 2.

Example 2

100 cc of the concentrated copper particulate dispersion (B) prepared in the same manipulation as Example 1 was added thereinto citric acid in an amount of 20 mass % relative to copper, followed by further addition of triethylene glycol in an amount of 4 mass % relative to copper particulates, and small amounts of water and ethyl carbitol, so as to adjust a concentration and a viscosity, thereby producing a copper particulate dispersion of sample 2 according to the present invention.

The obtained copper particulate dispersion of sample 2 was used and coated onto a glass substrate and then sintered in the same manner as Example 1, to form an electroconductive film. The obtained electroconductive film was evaluated in the same manner as Example 1, and the result thereof is listed in Table 2. For the copper particulate dispersion of sample 2, coated amounts of PVP and citric acid, an addition amount of citric acid, and the like, are collectively listed in Table 1, similarly to Example 1.

Example 3

100 cc of the concentrated copper particulate dispersion (B) prepared in the same manipulation as Example 1 was added thereinto lactic acid in an amount of 7 mass % relative to copper, followed by further addition of diethylene glycol in an amount of 5 mass % relative to copper particulates, and a small amount of water, so as to adjust a concentration and a viscosity, thereby producing a copper particulate dispersion of sample 3 according to the present invention.

The obtained copper particulate dispersion of sample 3 was used and coated onto a glass substrate and then sintered in the same manner as Example 1, to form an electroconductive film. The obtained electroconductive film was evaluated in the same manner as Example 1, and the result thereof is listed in Table 2. For the copper particulate dispersion of sample 3, coated amounts of PVP and citric acid, an addition amount of lactic acid, and the like, are collectively listed in Table 1, similarly to Example 1.

Example 4

100 cc of the concentrated copper particulate dispersion (B) prepared in the same manipulation as Example 1 was added thereinto malic acid in an amount of 15 mass % relative to copper, followed by further addition of triethylene glycol in an amount of 5 mass % relative to copper particulates, and small amounts of water and ethyl carbitol, so as to adjust a concentration and a viscosity, thereby producing a copper particulate dispersion of sample 4 according to the present invention.

The obtained copper particulate dispersion of sample 4 was used and coated onto a glass substrate and then sintered in the same manner as Example 1, to form an electroconductive film. The obtained electroconductive film was evaluated in the same manner as Example 1, and the result thereof is listed in Table 2. For the copper particulate dispersion of sample 4, coated amounts of PVP and citric acid, an addition amount of malic acid, and the like, are collectively listed in Table 1, similarly to Example 1.

Example 5

To substitute part of PVP, added into 100 cc of the concentrated copper particulate dispersion (A) was a mixed solution containing: a mixed solvent of ethanol and ethyl carbitol at a ratio of 3:1; and 0.5 mass % of citric acid dissolved in the solvent; in a manner to dilute the dispersion up to 10 times the volume, and then the diluted dispersion was concentrated down to 100 cc by discharging the solvent therefrom by ultrafiltration of cross-flow type with stirring. Further, the concentrated dispersion was diluted up to 10 times the volume by adding thereto the aqueous 0.5 mass % citric acid mixed solution, followed by concentration down to 120 cc by conducting the same ultrafiltration manipulation. The thus obtained concentrated copper particulate dispersion (C) was excellent in dispersibility, and free of precipitation.

For the concentrated copper particulate dispersion (C), there was evaluated a coated amount of polyvinyl pyrrolidone (PVP) in the same manner as Example 1, and as a result, the weight decrease corresponding to PVP coatings was evaluated to be 1.5%, thereby clarifying that 2.5 mass % corresponding to about 60% of the PVP (4 mass %) coated on copper particulates was substituted by citric acid.

Thereafter, 100 cc of the concentrated copper particulate dispersion (C) was added thereinto citric acid in an amount of 7.5 mass % relative to copper and malic acid in an amount of 7.5 mass % relative to copper, followed by further addition of ethylene glycol in an amount of 6 mass % relative to copper particulates, and a small amount of water, so as to adjust a concentration and a viscosity, thereby producing a copper particulate dispersion of sample 5 according to the present invention.

The obtained copper particulate dispersion of sample 5 was used and coated onto a glass substrate and then sintered in the same manner as Example 1, to form an electroconductive film. The obtained electroconductive film was evaluated in the same manner as Example 1, and the result thereof is listed in Table 2. For the copper particulate dispersion of sample 5, coating amounts of PVP and citric acid, addition amounts of citric acid and malic acid, and the like, are collectively listed in Table 1, similarly to Example 1.

Example 6

There was conducted the same manipulation as Example 1 except for adoption of a concentration of 5 mass % for the aqueous citric acid solution used for substitution, thereby obtaining a concentrated copper particulate dispersion (D). The obtained concentrated copper particulate dispersion (D) was excellent in dispersibility, and free of precipitation.

For the concentrated copper particulate dispersion (D), there was evaluated a coated amount of polyvinyl pyrrolidone (PVP) in the same manner as Example 1, and as a result, the weight decrease corresponding to PVP coatings was evaluated to be 1.5%, thereby clarifying that 2.5 mass % corresponding to about 60% of the PVP (4 mass %) coated on copper particulates was substituted by citric acid. Further, the weight decrease corresponding to citric acid coatings was evaluated to be 3%.

Thereafter, 100 cc of the concentrated copper particulate dispersion (D) was added thereinto citric acid in an amount of 5 mass % relative to copper particulates, followed by further addition of water and ethylene glycol in an amount of 5 mass % relative to copper particulates, and a small amount of water, so as to adjust a concentration and a viscosity, thereby producing a copper particulate dispersion of sample 6 according to the present invention.

The obtained copper particulate dispersion of sample 6 was used and coated onto a glass substrate and then sintered in the same manner as Example 1 while setting a sintering temperature at 300° C., to form an electroconductive film. The obtained electroconductive film was evaluated in the same manner as Example 1, and the result thereof is listed in Table 2. For the copper particulate dispersion of sample 3, coating amounts of PVP and citric acid, an addition amount of citric acid, and the like, are collectively listed in Table 1, similarly to Example 1.

Comparative Example 1

Without substituting part of PVP, 100 cc of the concentrated copper particulate dispersion (A) was directly added thereinto citric acid in an amount of 15 mass % relative to copper, followed by further addition of ethylene glycol in an amount of 5 mass % relative to copper particulates, and small amounts of water and ethanol, so as to adjust a concentration and a viscosity, thereby producing a copper particulate dispersion of sample 7 as Comparative Example.

For the copper particulate dispersion of sample 7, coating amounts of PVP and citric acid, an addition amount of citric acid, and the like, are collectively listed in Table 1, similarly to Example 1. Note that the PVP coated amount of copper particulates was unchanged to be 4 mass %, because of omission of a substitutional manipulation for part of PVP.

The obtained copper particulate dispersion of sample 7 was used to draw a circuit pattern onto a glass substrate by an inkjet printer, and the drawing was conducted without any clogging of an inkjet nozzle. This pattern was sintered in the same manner as Example 1 to form an electroconductive film, the thus obtained electroconductive film was evaluated in the same manner as Example 1, and the result thereof is listed in Table 2.

Comparative Example 2

100 g of the concentrated copper particulate dispersion (A) was directly diluted to 10 times the volume by adding pure water thereinto, and then the diluted dispersion was concentrated down to 100 cc by discharging the solvent therefrom by ultrafiltration of cross-flow type with stirring. Further, the concentrated dispersion was diluted up to 10 times the volume by adding pure water thereinto, followed by concentration down to 120 cc by conducting the same ultrafiltration manipulation, thereby producing a copper particulate dispersion of sample 8 as Comparative Example.

For the obtained copper particulate concentrated solution of sample 8, there was evaluated a coated amount of polyvinyl pyrrolidone (PVP) in the same manner as Example 1, and as a result, there was detected a weight decrease of 1.8% from 180° C. through 420° C., thereby clarifying that the PVP coated amount was 1.8 mass %.

Further, the copper particulate concentrated solution of sample 8 was recognized to include precipitation of copper particulates, and was inappropriate as an ink-oriented copper particulate dispersion due to insufficient dispersibility, so that a sintering test for forming an electroconductive film was not conducted. For the copper particulate dispersion of sample 8, a coated amount of PVP are collectively listed in Table 1, similarly to Example 1.

Comparative Example 3

Without dilution by addition of hydroxycarboxylic acid, 100 cc of the concentrated copper particulate dispersion (B) prepared in the same manner as Example 1 was adjusted in terms of concentration and viscosity by adding thereinto diethylene glycol in an amount of 5 mass % relative to copper particulates and a small amount of water, thereby producing a copper particulate dispersion of sample 9 as Comparative Example.

The obtained copper particulate dispersion of sample 9 as Comparative Example was used and coated onto a glass substrate and then sintered in the same manner as Example 1, to form an electroconductive film. The obtained electroconductive film was evaluated in the same manner as Example 1, and the result thereof is listed in Table 2. For the copper particulate dispersion of sample 9, coated amounts of PVP and citric acid, and the like, are collectively listed in Table 1, similarly to Example 1.

Comparative Example 4

100 cc of the concentrated copper particulate dispersion (B) prepared in the same manipulation as Example 1 was added thereinto citric acid in an amount of 4 mass % relative to copper, followed by further addition of diethylene glycol in an amount of 5 mass % relative to copper particulates, and a small amount of water, so as to adjust a concentration and a viscosity, thereby producing a copper particulate dispersion of sample 10 as Comparative Example.

The obtained copper particulate dispersion of sample 10 as Comparative Example was used and coated onto a glass substrate and then sintered in the same manner as Example 1, to form an electroconductive film. The obtained electroconductive film was evaluated in the same manner as Example 1, and the result thereof is listed in Table 2. For the copper particulate dispersion of sample 10, coating amounts of PVP and citric acid, an addition amount of citric acid, and the like, are collectively listed in Table 1, similarly to Example 1.

TABLE 1

| | Coated Amount (wt %/Cu) | | | Hydroxycarboxylic acid for addition | |
|---|---|---|---|---|---|
| Sample | PVP | Citric acid | Dispersibility | Member | Addition amount (wt %/Cu) |
| 1 | 2.0 | 2.0 | Good | Citric acid | 15 |
| 2 | 2.0 | 2.0 | Good | Citric acid | 20 |
| 3 | 2.0 | 2.0 | Good | Lactic acid | 7 |
| 4 | 2.0 | 2.0 | Good | Malic acid | 15 |
| 5 | 1.5 | 2.5 | Good | Citric acid | 7.5 |
| | | | | Malic acid | 7.5 |
| 6 | 1.5 | 3.0 | Good | Citric acid | 5 |
| 7* | 4.0 | — | Good | Citric acid | 15 |
| 8* | 1.8 | — | Bad | — | — |
| 9* | 2.0 | 2.0 | Good | — | — |
| 10* | 2.0 | 2.0 | Good | Citric acid | 4 |

(Note):
Sample marked with "*" in Table is Comparative Example.

TABLE 2

| | Sintering condition | | Sintering test result | | |
|---|---|---|---|---|---|
| Sample | Temperature (° C.) | Time (min.) | Film configuration | Film thickness (μm) | Volume specific resistance (μΩ · cm) |
| 1 | 280 | 5 | Good | 1.0 | 7 |
| | 250 | 5 | | 1.0 | 10 |
| 2 | 280 | 5 | Good | 0.5 | 5 |
| | 250 | 10 | | 1.5 | 15 |
| 3 | 280 | 5 | Good | 1.0 | 8 |
| | 250 | 7 | | 2.0 | 18 |
| 4 | 280 | 5 | Good | 0.5 | 6 |
| | 250 | 6 | | 1.0 | 10 |
| 5 | 280 | 5 | Good | 0.5 | 5 |
| | 250 | 7 | | 1.0 | 9 |
| 6 | 300 | 7 | Good | 1.0 | 15 |
| 7* | 280 | 5 | Good | 1.0 | 80 |
| 8* | Omission of sintering test due to bad dispersibility | | | | |
| 9* | 280 | 5 | Occurrence of many cracks | 1.0 | 250 |
| | 250 | 7 | | 1.0 | 320 |
| 10* | 280 | 5 | Occurrence of some cracks | 1.0 | 120 |
| | 250 | 7 | | 1.0 | 220 |

As understood from the above results, the ink-oriented copper particulate dispersions according to the present invention were each capable of forming an electroconductive film exhibiting metallic luster, excellent in continuity, and free of defects, even by low-temperature sintering at 300° C. or lower. Moreover, the obtained electroconductive films were each excellent in electroconductivity such that the volume specific resistance was 20 μΩ·cm or less, thereby clarifying that the electroconductive films are desirable for usage as wiring materials, respectively.

The invention claimed is:

1. A copper particulate dispersion comprising:
   copper particulates having diameters of 100 nm or less and coated with a coating consisting of water-soluble polymers and hydroxycarboxylic acid, the coating containing a ratio of 50 to 67 mass % of the hydroxycarboxylic acid;
   hydroxycarboxylic acid; and
   polyhydric alcohol and/or a polar solvent,
   wherein the total amount of water-soluble polymers and hydroxycarboxylic acid in the coating and hydroxycarboxylic acid added to the solvent is 9.5 mass % or more relative to the copper particulates.

2. The copper particulate dispersion of claim 1, wherein the water-soluble polymers are at least one member selected from the group consisting of polyvinyl pyrrolidone, polyethyleneimine, polyallylamine, polyvinyl alcohol, and gelatin.

3. The copper particulate dispersion of claim 1, wherein the hydroxycarboxylic acid is at least one member selected from the group consisting of lactic acid, malic acid, citric acid, and gluconic acid.

4. The copper particulate dispersion of claim 1, wherein the polyhydric alcohol is at least one member selected from the group consisting of ethylene glycol, diethylene glycol, triethylene glycol, tetraethylene glycol, and polyethylene glycol.

5. The copper particulate dispersion of claim 1, wherein a coated amount of the water-soluble polymers is 3 mass % or less relative to copper particulates, and a total coated amount of the water-soluble polymers and the hydroxycarboxylic acid is 2.5 mass % or more relative to copper particulates.

6. The copper particulate dispersion of claim 1, wherein the polar solvent is at least one member selected from the group consisting of water, methanol, ethanol, isopropanol, methyl carbitol, ethyl carbitol, and butyl carbitol.

7. The copper particulate dispersion of claim 1, wherein said water-soluble polymer consists of polyvinyl pyrrolidone and said hydroxycarboxylic acid is selected from the group consisting of citric acid, lactic acid and malic acid.

* * * * *